(12) United States Patent
Lee et al.

(10) Patent No.: US 11,820,885 B2
(45) Date of Patent: Nov. 21, 2023

(54) RESIN COMPOSITION, METAL LAMINATE AND PRINTED CIRCUIT BOARD USING SAME, AND METHOD FOR MANUFACTURING METAL LAMINATE

(71) Applicant: DOOSAN CORPORATION, Seoul (KR)

(72) Inventors: Jinsoo Lee, Yongin-si (KR); Hyungkyu Kim, Yongin-si (KR); Kyeongwoon Cho, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 217 days.

(21) Appl. No.: 17/418,434

(22) PCT Filed: Sep. 2, 2019

(86) PCT No.: PCT/KR2019/011257
§ 371 (c)(1),
(2) Date: Jun. 25, 2021

(87) PCT Pub. No.: WO2020/138642
PCT Pub. Date: Jul. 2, 2020

(65) Prior Publication Data
US 2022/0025167 A1    Jan. 27, 2022

(30) Foreign Application Priority Data
Dec. 27, 2018    (KR) .................. 10-2018-0170678

(51) Int. Cl.
*B32B 15/20*    (2006.01)
*C08L 27/18*    (2006.01)
(Continued)

(52) U.S. Cl.
CPC ............ *C08L 27/18* (2013.01); *B32B 15/043* (2013.01); *B32B 15/20* (2013.01); *B32B 37/10* (2013.01);
(Continued)

(58) Field of Classification Search
CPC ....... B32B 15/20; B32B 15/043; B32B 37/10; C08L 27/18; C09J 7/28; C09J 127/18
See application file for complete search history.

(56) References Cited

U.S. PATENT DOCUMENTS

2004/0147676 A1* 7/2004 Irie .................. C08L 21/00
525/199
2015/0307685 A1   10/2015 Pham
2018/0371228 A1   12/2018 Yasuda et al.

FOREIGN PATENT DOCUMENTS

CN   1373792 A    10/2002
EP   0 079 589 A1   5/1983
(Continued)

OTHER PUBLICATIONS

International Searching Authority, International Search Report of PCT/KR2019/011257 dated Dec. 23, 2019 [PCT/ISA/210].

*Primary Examiner* — Elizabeth E Mulvaney
(74) *Attorney, Agent, or Firm* — Sughrue Mion, PLLC

(57) ABSTRACT

A resin composition, a metal laminate, and a printed circuit board which use the resin composition are disclosed. A method for manufacturing the metal laminate is also disclosed. The resin composition contains at least one elastomer selected from the group consisting of a fluoroelastomer or a styrene-based elastomer; a fluororesin filler; and an inorganic filler.

18 Claims, 1 Drawing Sheet

(51) Int. Cl.
  *C09J 7/28*   (2018.01)
  *B32B 15/04*  (2006.01)
  *B32B 37/10*  (2006.01)
  *C09J 127/18* (2006.01)
  *H05K 1/03*   (2006.01)

(52) U.S. Cl.
  CPC ............... *C09J 7/28* (2018.01); *C09J 127/18* (2013.01); *H05K 1/0373* (2013.01); *B32B 2255/06* (2013.01); *B32B 2255/26* (2013.01); *B32B 2307/204* (2013.01); *B32B 2307/30* (2013.01); *B32B 2307/54* (2013.01); *B32B 2311/12* (2013.01); *B32B 2457/08* (2013.01); *C08L 2203/20* (2013.01); *C09J 2400/163* (2013.01); *C09J 2427/00* (2013.01); *H05K 2201/0212* (2013.01); *H05K 2201/0338* (2013.01)

(56) References Cited

FOREIGN PATENT DOCUMENTS

| | | | |
|---|---|---|---|
| JP | 61-35245 | A | 2/1986 |
| JP | 06-098736 | B2 | 12/1994 |
| JP | 2007-154043 | A | 6/2007 |
| JP | 2009-052028 | A | 3/2009 |
| JP | 2012-153880 | A | 8/2012 |
| JP | 2016-166347 | A | 9/2016 |
| KR | 10-2002-0033188 | A | 5/2002 |
| KR | 10-2018-0121884 | A | 11/2018 |
| KR | 10-2022-0033188 | A | 3/2022 |
| WO | 01/23470 | A1 | 4/2001 |
| WO | 2018/117636 | A1 | 6/2018 |

\* cited by examiner

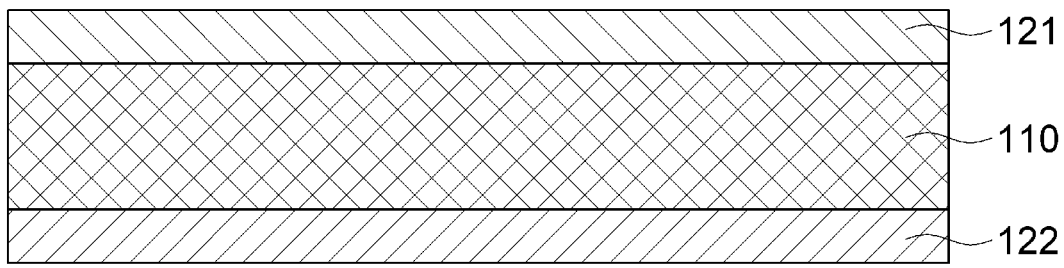

RESIN COMPOSITION, METAL LAMINATE AND PRINTED CIRCUIT BOARD USING SAME, AND METHOD FOR MANUFACTURING METAL LAMINATE

CROSS REFERENCE TO RELATED APPLICATIONS

This application is a National Stage of International Application No. PCT/KR2019/011257, filed Sep. 2, 2019, claiming priority to Korean Patent Application No. 10-2018-0170678, filed Dec. 27, 2018.

TECHNICAL FIELD

The present invention relates to a resin composition, a metal laminate and a printed circuit board using the same, and a method for manufacturing the metal laminate.

BACKGROUND ART

Due to the recent development of wireless communication technology, services centered on simple voice transmission and reception have been expanded to various multimedia application services such as video broadcasting, video phone, and file transfer. And thus, the frequency band at which communication and electronic devices are used has also been expanded from the MHz range to the GHz band such as 60 GHz, 77 GHz, or 94 GHz band, which enables broadband.

However, as the frequency band at which communication and electronic devices are used increases, the transmission loss of electric signals increases, so that problems such as heat generation, signal reduction, and delay may occur. Examples of main causes of such transmission loss include a conductor loss generated mainly by the series resistance of a conductor forming a transmission circuit and a dielectric loss due to the leakage current flowing through an insulator of a printed circuit board. Among them, the dielectric loss is proportional to the product of the square root of the relative dielectric constant of an insulating layer, the dissipation factor and the frequency of an electric signal. For this reason, the higher the frequency of the electric signal, the larger the dielectric loss. Therefore, there is a need for the development of an insulating material having a low dielectric constant and a low dissipation factor and a printed circuit board using the same in order to reduce the transmission loss of communication and electronic devices in the high frequency to ultra-high frequency region.

DISCLOSURE

Technical Problem

An object of the present invention is to provide a resin composition having excellent adhesiveness and heat resistance and low dielectric loss characteristics, and a metal laminate and a printed circuit board which use the same.

Alternatively, another object of the present invention is to provide a method for manufacturing a metal laminate using the resin composition without an extrusion molding process and a high-temperature firing process.

Technical Solution

To achieve the aforementioned objects, the present invention provides a resin composition including: at least one elastomer selected from the group consisting of a fluoroelastomer and a styrene-based elastomer; a fluororesin filler; and an inorganic filler.

Optionally, the resin composition may further include an organic solvent.

Alternatively, the present invention provides a metal laminate comprising a resin layer formed of the above-described resin composition and having a dissipation factor (Df) of 0.0005 to 0.0020 at 10 GHz; and a metal layer disposed on both sides of the resin layer, respectively.

In addition, the present invention provides a method for manufacturing a metal laminate, the method including: preparing two unit members in which a resin layer applied on one surface of a metal base material is formed by applying the above-described resin composition on one surface of the metal base material and drying the resin composition at 50 to 180° C.; and laminating the two unit members and pressurizing the two unit members, such that the resin layers of the unit members are brought into contact with each other.

Advantageous Effects

Since the resin composition of the present invention has excellent heat resistance and processability and a low dielectric loss, the resin composition can be usefully used for a printed circuit board used in various electric, electronic, and communication devices such as a mobile communication device that handles high frequency to ultra-high frequency signals or a base station device thereof, a network-related electronic device such as a server and a router, an automotive radar device, and a large computer.

Further, since a resin layer can be formed by a simple method of using the resin composition to directly coat a metal base material with the resin composition, and then drying the resin composition without a high-temperature extrusion molding process and a firing process of 350° C. or higher, the present invention can simplify a process of manufacturing a metal laminate.

DESCRIPTION OF DRAWINGS

FIG. 1 is a cross-sectional view of a metal laminate according to an exemplary embodiment of the present invention.

DESCRIPTION OF MAIN REFERENCE NUMERALS OF DRAWINGS

100: Metal laminate
110: Resin layer
121: First metal layer
122: Second metal layer

BEST MODE

Hereinafter, the present invention will be described.

The present invention has been made in an effort to provide a resin composition which may be usefully used for a printed circuit board, particularly a printed circuit board for high frequency to ultra-high frequency applications.

In the related art, a fluororesin has been used as a material for an insulating layer (resin layer) for a printed circuit board having low dielectric constant and low dielectric loss characteristics. However, the fluororesin has a high melting point of about 300° C. or higher. For this reason, in the related art, in order to form an insulating layer using a fluororesin, a high-temperature extrusion molding process and a firing process of about 300° C. or higher are performed, thereby resulting in a high manufacturing cost and a deterioration in molding processability.

Therefore, the present invention is characterized in that a fluoroelastomer or a styrene-based elastomer having a low dissipation factor in the high frequency to ultra-high frequency band is mixed with an inorganic filler and an organic filler, and a fluorine-containing filler such as perfluoro alkoxy alkene (PFA) is mixed as the organic filler. As described above, the present invention uses the elastomer as a binder resin unlike a manufacture of a metal laminate in the related art, which forms an insulating layer of a fluororesin through a high-temperature extrusion molding process and a firing process, and thus, the elastomer may bind an inorganic filler and a fluororesin filler by a method of directly coating and drying the composition on a metal foil without a high-temperature extrusion molding process and a high-temperature firing process. Accordingly, the present invention may decrease the manufacturing cost of a metal laminate and may enhance the ease of processing.

Further, the present invention is based on an elastomer having low dielectric characteristics and easy processability, and a fluorine-containing filler having a low dielectric constant is applied thereto by adjusting at a specific blending ratio. Accordingly, the present invention may exhibit excellent low dielectric constant (Dk) and low dielectric loss (Df) characteristics and may simultaneously provide high glass transition temperature (Tg) and excellent heat resistance, etc.

<Resin Composition>

The present invention provides a resin composition capable of being used for a printed circuit board, particularly a printed circuit board which can be used in a high frequency to ultra-high frequency band. The resin composition will be described in more detail as follows.

The resin composition according to the present invention may include: at least one elastomer selected from the group consisting of a fluoroelastomer and a styrene-based elastomer; a fluororesin filler; and an inorganic filler, and may optionally further include an organic solvent.

(a) Elastomer

In the resin composition of the present invention, an elastomer is a binder resin capable of binding both an inorganic filler and an organic filler. As an example, the resin composition may include a thermoplastic elastomer. In this case, the thermoplastic elastomer may be melted during high-temperature pressing to easily form a resin layer.

The elastomer according to the present invention includes at least one selected from the group consisting of a fluoroelastomer and a styrene-based elastomer. The fluoroelastomer and the styrene-based elastomer may easily bind an inorganic filler and an organic filler, and have low dielectric characteristics. Specifically, the elastomer of the present invention has a dissipation factor (Df) of 0.0005 to 0.0020 at 10 GHz. Alternatively, the elastomer of the present invention has a dielectric constant (Dk) of 2.0 to 3.0 at 10 GHz.

When the elastomer of the present invention having a low dissipation factor and a low dielectric constant is used as a binder resin as described above, a resin layer having a low dielectric loss may be easily formed by a method of directly coating a metal foil with a resin composition and drying the resin composition without a high-temperature extrusion molding process and a high-temperature firing process.

The fluoroelastomer of the present invention is a type of thermoplastic elastomer, and is an elastomer containing at least one fluorine (F) in at least one repeating unit. Such a fluoroelastomer not only has a dissipation factor (Df) of 0.0005 to 0.0020 and a dielectric constant of 2.0 to 3.0 at 10 GHz, but also has a low modulus. Examples of a fluoroelastomer that can be used in the present invention include a copolymer including two or more of vinylidene fluoride (VDF), hexafluoropropylene (HFP), and tetrafluoroethylene (TFE); a tetrafluoroethylene-propylene-based copolymer; a vinylidene fluoride-tetrafluoroethylene-hexafluoropropylene-based copolymer; a tetrafluoroethylene-perfluoroalkyl vinyl ether-based copolymer, and the like, but are not limited thereto. These may be used either alone or in a mixture of two or more thereof.

The content of fluorine in the fluoroelastomer of the present invention is not particularly limited, but when the content is in a range of about 65 to 80 wt % per one molecule of the fluoroelastomer, the fluoroelastomer may have a dissipation factor in a range of about 0.0005 to 0.0020 at 10 GHz.

The styrene-based elastomer of the present invention is a type of thermoplastic elastomer, and is an elastomer containing at least one styrene group in at least one repeating unit. Such a styrene-based elastomer may have a dissipation factor (Df) of 0.0005 to 0.0020 and a dielectric constant of 2.0 to 3.0 at 10 GHz.

The styrene-based elastomer that can be used in the present invention may be a copolymer elastomer of styrene and a $C_2$~$C_{10}$ aliphatic unsaturated hydrocarbon. Specifically, examples of the styrene-based elastomer include a styrene-butadiene-styrene di-block copolymer (SBS), a styrene-ethylene-butylene-styrene tri-block copolymer (SEBS), a styrene-ethylene-ethylene-propylene-styrene tri-block copolymer (SEEPS), a styrene-isoprene-styrene di-block copolymer, a styrene-ethylene-propylene-styrene tri-block copolymer, and the like, but are not limited thereto. These may be used either alone or in a mixture of two or more thereof.

The content of a styrene group in the styrene-based elastomer of the present invention is not particularly limited, but when the content is in a range of about 10 to 40 wt % per one molecule of the styrene-based elastomer, the styrene-based elastomer may have a dissipation factor in a range of about 0.0005 to 0.0020 at 10 GHz.

The elastomer of the present invention has a melt flow rate (MFR) of about 0.01 g/10 min or less under conditions of 230° C. and 2 kg. Alternatively, the viscosity of a solution prepared by dissolving 5 wt % of the elastomer of the present invention in toluene is about 50 to 100 cps. Therefore, the viscosity of the resin composition of the present invention may be adjusted in a range of about 150 to 500 cps to improve the processability at the time of manufacturing the metal laminate.

The elastomer of the present invention has a thermal decomposition temperature (Td) of about 350° C. or higher (specifically, about 350 to 1000° C., more specifically, about 350 to 700° C., and even more specifically about 350 to 500° C.), which is high. Therefore, the resin composition of the present invention may form a resin layer having excellent thermal stability at high temperature.

In the resin composition of the present invention, the content of the elastomer is preferably in a range of about 1 to 10 wt % based on the total amount of the resin composition (excluding the organic solvent). When the content of the elastomer is less than about 1 wt %, the effect of binding the filler may deteriorate, while when the content of the elastomer is more than 10 wt %, the adhesiveness to the metal layer (for example, copper foil) is reduced, so that the metal layer may be peeled off during the production and use of the metal laminate.

(b) Fluororesin Filler

In the resin composition of the present invention, the fluororesin filler is fluororesin particles containing fluorine (F), and may implement low dielectric constant and low dielectric loss characteristics of the resin layer.

Specifically, the fluororesin filler has a dielectric constant (Dk) of about 2.1 or less and a dissipation factor (Df) of about 0.0002 or less. For example, PTFE has a Dk of about 2.1 and a Df of about 0.0002, and PFA has a Dk of about 2.1 and a Df of about 0.0002. As described above, since the fluororesin filler has a low dissipation factor and a low dielectric constant, it is possible to implement the low dielectric constant and low dielectric loss characteristics of the resin layer.

In addition, the fluororesin filler has a melting point (Tm) of about 300° C. or higher, and the fluororesin filler is not a liquid but a solid at room temperature, and is a particle-type filler such as powder or fiber having a predetermined form. For example, PTFE has a Tm of about 350° C., and PFA has a Tm of about 320° C. Therefore, the fluororesin filler is bound by an elastomer in the form of particles at the time of drying the resin composition before the high temperature pressing process, and thus is included in the resin layer, whereas the fluororesin filler is melted by a high-temperature press process of about 350° C. or higher to form a polymer matrix of the resin layer. In addition, since the fluororesin filler does not contain a dispersant unlike a fluororesin dispersion, the heat resistance and adhesiveness of the metal laminate may be improved.

The fluororesin filler that can be used in the present invention is not particularly limited as long as the fluororesin filler is particles formed of a fluorine-containing resin in the art. Examples of the fluororesin filler include polytetrafluoroethylene (PTFE), perfluoroalkoxy alkane (PFA), a tetrafluoroethylene-hexafluoropropylene copolymer (FEP), polychlorotrifluoroethylene (PCTFE), an ethylene-tetrafluoroethylene copolymer (ETFE), a tetrafluoroethylene-chlorotrifluoroethylene copolymer (TFE/CTFE), an ethylene-chlorotrifluoroethylene copolymer (ECTFE), polychlorotrifluoroethylene (PCTFE), and the like, but are not limited thereto. Among them, PFA and PTFE are preferred because PFA and PTFE each have a Df of 0.0002 or less.

The fluororesin filler of the present invention has a melt flow rate (MFR) of about 1 to 50 g/10 min under conditions of about 372° C. and about 2 kg.

The more uniformly dispersed such a fluororesin filler is in the resin composition, the more the dielectric characteristics of the resin composition can be improved, and the fluororesin filler is also suitable for the manufacture of a metal laminate by a simple coating process without a high-temperature extrusion moding and a high-temperature firing. Accordingly, in the present invention, it is preferred to adjust the shape, size (average particle diameter), and content of the fluororesin filler within specific ranges, respectively.

Specifically, the shape of the fluororesin filler includes a spherical shape, a flake, a needle shape (dendrite), a conical shape, a pyramid shape, an amorphous shape, and the like. Among them, when a spherical fluororesin filler is used, the surface area of the filler is minimized, so that the processing characteristics of the resin composition can be improved, and the isotropic characteristics can be imparted to the resin layer.

Alternatively, the fluororesin filler may have an average particle diameter in a range of about 0.01 to 50 μm. When the fluororesin filler has the above-described average particle diameter, the fluororesin filler is uniformly dispersed in the resin composition without agglomeration phenomenon, and thus is suitable for manufacturing a resin layer for a printed circuit board. As described above, when the fluororesin filler has the above-described average particle diameter, the packing density of the resin layer may be about 2.1 to 2.4 g/ml.

In the present invention, a type of fluororesin filler having the same shape and average particle diameter may be used alone, or two or more types of fluororesin fillers having different shapes and/or average particle diameters may be used in mixtures.

In the resin composition of the present invention, the content of the fluororesin filler is not particularly limited. However, when the content of the fluororesin filler is too small, the adhesive force with a metal layer (for example, a copper foil) in the metal laminate may deteriorate, thereby resulting in a peeling phenomenon of the metal layer, while when the content of the fluororesin filler is too high, the CTE of the resin layer may be decreased due to the relatively low content of the inorganic filler. Accordingly, it is appropriate to adjust the content of the fluororesin filler in a range of about 25 to 75 wt % based on the total amount of the resin composition (excluding the organic solvent). In this case, the resin composition of the present invention may form a resin layer having excellent heat resistance and adhesiveness and low dielectric constant and dielectric loss.

(c) Inorganic Filer

The resin composition according to the present invention includes an inorganic filler. The inorganic filler reduces a difference in coefficient of thermal expansion (CTE) between a resin layer formed of a resin composition and another layer (for example, a metal foil), and thus may effectively enhance warpage characteristics, low expansion, mechanical strength (toughness), and low stress of a final product.

Non-limiting examples of the inorganic filler that can be used in the present invention include silica, such as natural silica, fused silica, amorphous silica, and crystalline silica; boehmite, alumina, talc, glass (for example, spherical glass), calcium carbonate, magnesium carbonate, magnesia, clay, calcium silicate, titanium oxide, antimony oxide, glass fiber, aluminum borate, barium titanate, strontium titanate, calcium titanate, magnesium titanate, bismuth titanate, titania (for example, $TiO_2$), barium zirconate, calcium zirconate, boron nitride, silicon nitride, talc, mica, and the like. These inorganic fillers may be used either alone or in a mixture of two or more thereof. Among them, silica, alumina, and titania have low dielectric constants, so that the dielectric constant and dissipation factor of the resin layer can be reduced while reducing the difference in the coefficient of thermal expansion between the resin layer and the metal layer.

According to an example, the inorganic filler may include one or more selected from the group consisting of silica (for example, $SiO_2$), alumina (for example, $Al_2O_3$), and titania (for example, $TiO_2$). Specifically, the inorganic filler may include (a) silica, and (b) alumina or titania. In this case, depending on the mixing ratio of silica and alumina (or titanium oxide), the electrical characteristics of not only the resin layer but also the metal laminate vary, and in particular, the dielectric characteristics vary depending on the temperature. For example, in the resin composition of the present invention, the inorganic filler may include (a) silica and (b)

alumina or titania at a weight ratio of 0.5 to 12:1. In particular, when the inorganic filler includes (a) silica and (b) alumina or titania at a ratio of 1 to 10:1 by weight, the resin composition of the present invention may form a resin layer having excellent electrical characteristics and a temperature coefficient of dielectric constant (TCK) close to about 0 ppm/° C. at high frequencies in the mmWave region.

The size (for example, average particle diameter), shape and content of the inorganic filler are important parameters that affect the characteristics of the resin layer.

Specifically, the inorganic filler may have an average particle diameter in a range of about 5 to 20 μm. This is advantageous in terms of the dispersibility of inorganic filler.

In addition, the shape of the inorganic filler is not particularly limited, and includes, for example, a spherical shape, a flake, a needle shape (dendrite), a conical shape, a pyramid shape, an amorphous shape, and the like.

In the present invention, a type of inorganic filler having the same shape and average particle diameter may be used alone, or two or more types of inorganic fillers having different shapes and/or average particle diameters may be used in mixtures.

In the resin composition of the present invention, the content of the inorganic filler is not particularly limited, and may be appropriately adjusted in consideration of the above-described warpage characteristics, mechanical properties, and the like. However, when the content of the inorganic filler is excessive, the content is disadvantageous in moldability and may reduce the adhesive force of the resin layer. As an example, the content may be about 15 to 65 wt % based on the total amount of the resin composition (excluding the organic solvent).

(d) Organic Solvent

The resin composition of the present invention may further include an organic solvent.

The organic solvent that can be used in the present invention is not particularly limited as long as the organic solvent can dissolve the above-described elastomer. Examples of the organic solvent include an aromatic compound such as toluene, xylene, and ethylbenzene, an alcohol-based compound such as methanol, ethanol, butanol, and isobutanol, a ketone-based compound such as acetone, methylisobutylketone, methyl amyl ketone, cyclohexanone, isophorone, and N-methylpyrrolidone, an ester-based compound such as ethyl acetate, butyl acetate, methyl cellosolve acetate, and the like, but are not limited thereto. These may be used either alone or in mixture of two or more thereof.

The content of the organic solvent may be used at a content known in the art, and may be a residual amount adjusted such that the total amount of the resin composition is 100 wt %. As an example, the content of the organic solvent may be in a range of about 60 to 100 parts by weight, specifically in a range of about 70 to 90 parts by weight, based on 100 parts by weight of the resin composition (excluding the organic solvent).

Meanwhile, the resin composition of the present invention may further include an additive such as a flame retardant, another thermosetting resin or thermoplastic resin, an ultraviolet absorber, an antioxidant, a polymerization initiator, a dye, a pigment, a dispersant, a thickener, a leveling agent, and a colorant known in the art, if necessary, within a range that does not impair the physical properties thereof, in addition to the above-described elastomer, fluororesin filler, inorganic filler, and organic solvent. The content of the additive can be used as known in the art, and may be, for example, about 0.0001 to 10 wt % based on the total amount of the resin composition.

The viscosity of the resin composition according to the present invention may be adjusted according to the type or content of elastomer, inorganic filler, and fluororesin filler in the composition, and the like, and may be, for example, about 150 to 500 cps. According to an example, when the resin composition has the above-described viscosity, a resin layer may be formed on a metal foil by a roll-to-roll coating method.

By a method of directly coating a metal foil with the resin composition of the present invention as described above and drying the resin composition without a filming process (paste extrusion, calendering) and a high-temperature firing process at the time of manufacturing a metal laminate, it is possible to easily form a metal laminate including a resin layer having a low dielectric constant and a low dielectric loss. Furthermore, the resin composition of the present invention may be applied to substrates of various materials, and may be applied to, for example, a polyimide (PI) substrate material to manufacture a flexible metal laminate.

<Metal Laminate and Method for Manufacturing the Same>

The present invention provides a metal laminate using the above-described resin composition.

Specifically, the metal laminate includes a resin layer formed of the resin composition. According to an example, the metal laminate includes a resin layer 110 and a first metal layer and a second metal layer 121 and 122 disposed on both sides of the resin layer, respectively, as illustrated in FIG. 1. Such a metal laminate has low dielectric constant and dissipation factor in a frequency band of about 1 to 100 GHz. Therefore, when the metal laminate of the present invention is applied to a printed circuit board for a high frequency to ultra-high frequency, the transmission loss of the printed circuit board may be lowered.

In the metal laminate of the present invention, the resin layer 110 is an insulating support member in which the above-described resin composition is cured, and the dissipation factor (Df) at 10 GHz is about 0.0005 to 0.0020, which is low.

According to an example, the metal laminate of the present invention includes a resin layer having a dissipation factor of about 0.0005 to 0.0020 and a dielectric constant of about 2 to 8, specifically about 2 to 6 at 10 GHz.

The resin layer 110 has an adhesive force of about 0.5 to 3 kgf/cm, which is high, with the first metal layer and the second metal layer 121 and 122. Therefore, the present invention may minimize the peeling between the resin layer and the metal layer regardless of the roughness on the surface of the metal layer brought into contact with the resin layer.

Alternatively, the resin layer has a modulus of about 0.2 to 2 GPa. Thereby, the mechanical properties of the metal laminate according to the present invention may be improved.

Alternatively, the resin layer has a coefficient of thermal expansion (CTE) of about 10 to 50 ppm/° C. Therefore, the metal laminate of the present invention may effectively improve the warpage characteristics, low expansion, mechanical strength (toughness), and low stress of the printed circuit board.

Further, the thickness of the resin layer is not particularly limited, and may be, for example, about 2.5 to 25 mm. In this case, the thickness of the resin layer is adjusted in consideration of the thicknesses of the metal layer and the metal laminate. For example, the ratio (D2/D1) of the thickness (D2) of the resin layer to the thickness (D1) of the metal layer may be about 8 to 35.

Such a resin layer 110 may be a single layer and may also be a double layer. For example, the resin layer may include: a first resin layer having a dissipation factor (Df) of about 0.0005 to 0.0020 at 10 GHz; and a second resin layer which is the same as or different from the first resin layer and has a dissipation factor (Df) of about 0.0005 to 0.0020 at 10 GHz. In this case, the first resin layer and the second resin layer are integrated.

In the metal laminate of the present invention, the first metal layer 121 and the second metal layer 122 are disposed on both surfaces of the resin layer 110, respectively. In this case, the first metal layer 121 and the second metal layer 122 may be the same as or different from each other.

In the present invention, the first metal layer and the second metal layer 121 and 122 can be used without particular limitation as long as the first metal layer and the second metal layer 121 and 122 are formed of typical metal components in the field applicable to a metal laminate or a printed circuit board. For example, each metal layer may be a thin film of one metal or an alloy thin films of two or more metals selected from the group consisting of copper (Cu), iron (Fe), nickel (Ni), titanium (Ti), aluminum (Al), silver (Ag), and gold (Au). Preferably, the first metal layer and the second metal layer 121 and 122 may be copper foils which have excellent electrical conductivity and are inexpensive. In this case, as the copper foil, a typical copper foil known in the art can be used without limitation, and all copper foils prepared by the rolling method and the electrolytic method can be used.

Alternatively, the metal layer may be a rough surface whose surface brought into contact with the resin layer has a predetermined surface roughness. The rough surface may have an average roughness (Rz) of about 0.5 to 2 µm. In this case, the present invention exhibits excellent transmission characteristics in the high frequency to ultra-high frequency region.

The thickness of the metal layer is not particularly limited, and may be in a range of about 1 to 50 µm in consideration of the thickness and mechanical properties of a final metal laminate.

Meanwhile, the above-described metal laminate of the present invention may be manufactured by various methods known in the art. However, since the present invention uses a resin composition including an elastomer having a low dissipation factor, a binder resin, a fluororesin filler, and an inorganic filler in manufacturing a metal laminate, a resin layer can be formed by a method of directly coating a metal foil with the resin composition and drying the resin composition without forming a film of the resin composition on a separate base material. Furthermore, the present invention forms a resin layer by a drying process of the resin composition without a high-temperature firing process before a laminating pressurization process, unlike the related art. Therefore, the present invention may reduce the manufacturing cost, and may improve productivity by shortening the processing time. Further, in the present invention, since a resin layer is formed by directly applying a resin composition on a metal foil, a metal laminate having excellent adhesive properties between the metal foil and the resin layer may be manufactured, unlike the case where the resin layer is separately formed and compressed with the metal foil.

As an example, a method for manufacturing a metal laminate includes: preparing two unit members in which a resin layer having a dissipation factor (Df) of about 0.005 to 0.0020 at 10 GHz is formed on one surface of a metal base material by applying the above-described resin composition on one surface of the metal base material and drying the resin composition at about 50 to 180° C.; and laminating the two unit members and pressurizing the two unit members, such that the resin layers of the unit members are brought into contact with each other. However, the method for manufacturing a metal laminate is not limited only by the manufacturing method, and the steps of each process may be modified or selectively mixed and carried out, if necessary.

Hereinafter, each step of manufacturing a metal laminate according to the present invention will be described.

(a) Step of Preparing Two Unit Members Two unit members are prepared by applying the above-described resin composition on one surface of a metal base material and drying the resin composition (hereinafter, 'Step S100').

Specifically, Step S100 includes directly applying (coating) the resin composition on one surface of a metal base material, and drying the applied resin composition.

The direct application (coating) method is not particularly limited, and includes, for example, a roll-to-roll coating method, and includes, specifically, comma coating, slot die coating, curtain coating, and the like.

The resin composition used in the present step is the same as that described in the resin composition section, and thus will be omitted.

Alternatively, the metal base material is a member formed of a typical metal in the art, and can be used without any particular limitation. For example, the metal base material may be a thin film of one metal or an alloy thin films of two or more metals selected from the group consisting of copper (Cu), iron (Fe), nickel (Ni), titanium (Ti), aluminum (Al), silver (Ag), and gold (Au). Preferably, the metal base material may be a copper foil which has excellent electrical conductivity and is inexpensive. In this case, as the copper foil, a typical copper foil known in the art can be used without limitation, and all copper foils prepared by the rolling method and the electrolytic method can be used.

The drying of the resin composition is a process for removing the organic solvent by drying the organic solvent in the resin composition, and may be performed at a temperature of about 50 to 180° C. for about 3 to 30 minutes to form a resin layer on the metal base material. As described above, in the present invention, the resin composition is only dried before the pressing process, and a high-temperature firing process of 350° C. or higher is not performed.

By the present step, two unit members are manufactured. Each manufactured unit member is the same or different, and includes a metal base material and a resin layer disposed on one surface of the metal base material.

(b) Laminating and Pressurizing of Unit Members

The two unit members obtained in Step S100 are laminated and pressurized (hereinafter, 'Step S200'). However, when the unit members are laminated, the unit members are laminated such that the resin layers of the unit members are brought into contact with each other.

The present step may be performed at a pressure of about 10 to 50 kgf/cm$^2$ for about 1 to 8 hours. In this case, the present step may be performed under a temperature condition of about 300 to 350° C. As an example, after two unit members are laminated using a press device equipped with a heating plate under the above-described temperature condition, an integrated metal laminate may be obtained by pressurizing the two unit members at a pressure of about 10 to 50 kfg/cm$^2$ for about 1 to 8 hours to compress resin layers. In particular, when the unit members are laminated and pressurized at a temperature of about 300 to 350° C., the fluororesin filler in the resin layer of each unit member is melted, so that the interlayer adhesive force between the resin layers may be further enhanced to integrate the resin layer.

<Printed Circuit Board>

Meanwhile, the present invention provides a printed circuit board including the above-described metal laminate.

As an example, the printed circuit board includes the metal laminate, and a circuit pattern may be formed on a metal layer (a first metal layer and/or a second metal layer) included in the metal laminate. In this case, the resin layer included in the metal laminate serves as an insulating support member.

As another example, the printed circuit board includes: the metal laminate; and one or more unit laminates disposed on the metal laminate, and the unit laminate includes a second resin layer and a third metal layer disposed on the second metal layer. In this case, the second resin layer is an interlayer insulating layer, and may be a resin layer formed of the above-described resin composition, or a resin layer formed of a resin known in the art, for example, polyimide, and the like.

The printed circuit board of the present invention may be manufactured by a typical method known in the art. For example, after through-hole plating is performed by opening a hole in the above-described metal laminate, a printed circuit board may be manufactured by etching a copper foil including a plating film to form a circuit.

Since the above-described printed circuit board of the present invention includes a metal laminate having a low dielectric constant and a low dissipation factor in a frequency band of about 1 GHz to 100 GHz, the dielectric loss in a frequency band of about 1 GHz to 100 GHz is low, and therefore, the transmission loss is also low. Therefore, the printed circuit board of the present invention may be usefully applied to various electric, electronic, and communication devices such as a mobile communication device that handles high frequency to ultra-high frequency signals or a base station device thereof, a network-related electronic device such as a server and a router, a large computer, and an automotive radar device.

Hereinafter, the present invention will be described in detail as follows through the Examples. However, the following Examples are only for exemplifying the present invention, and the present invention is not limited by the following Examples.

[Examples 1 to 8 and Comparative Examples 1 to 4]—Production of Resin Composition Resin compositions having the compositions and components shown in the following Table 1 are produced. In the following Table 1, the content units of the fluororesin, the inorganic filler, and the elastomer are based on the total amount of the resin composition (excluding the organic solvent) in parts by weight, and the content unit of the organic solvent is based on the total amount of 100 parts by weight of the resin composition (excluding the organic solvent) in parts by weight.

TABLE 1

|  |  | Example |  |  |  |  |  |  |  | Comparative Example |  |  |  |
|---|---|---|---|---|---|---|---|---|---|---|---|---|---|
|  |  | 1 | 2 | 3 | 4 | 5 | 6 | 7 | 8 | 1 | 2 | 3 | 4 |
| Fluororesin | PFA | 73 | 43 | 35 | 33 | 41 | 43 | 43 | 37 | — | 50 | 43 | 43 |
|  | PTFE | — | — | — | — | — | — | — | — | 50 | — | — | — |
| Inorganic filler | SiO$_2$ | 20 | 40 | 58 | 52 | 18 | 50 | 50 | 50 | 25 | 25 | 50 | 50 |
|  | Al$_2$O$_3$ | — | — | — | — | — | — | 5 | 11 | 25 | 25 | 11 | 11 |
|  | TiO$_2$ | 5 | 29 | 5 | 5 | 39 | 5 | — | — | — | — | — | — |
| Elastomer | SEEPS | 2 | 2 | 2 | 10 | 2 | — | 2 | 2 | — | — | — | — |
|  | FKM | — | — | — | — | — | — | 2 | — | — | — | — | — |
|  | NBR | — | — | — | — | — | — | — | — | — | — | 2 | — |
|  | PI | — | — | — | — | — | — | — | — | — | — | — | 2 |
| Organic solvent | Toluene | 80 | 80 | 80 | 80 | 80 | — | 80 | 80 | 80 | 80 | — | — |
|  | MEK | — | — | — | — | — | 80 | — | — | — | — | 80 | — |
|  | NMP | — | — | — | — | — | — | — | — | — | — | — | — |

\* PFA: Perfluoroalkoxy alkanes(Tm: 315° C., MFR: 1 to 30 g/10 min, Average particle diameter: 30 to 100 μm)
\* PTFE: Polytetrafluoroethylene (Tm: 327° C., MFR: 2 to 80 g/10 min, Average particle diameter: 20 to 100 μm)
\* SEEPS: styrene-ethylene-ethylene-propylene-styrene (thermal decomposition temperature: 390° C., MFR: < 0.1)
\* FKM: Fluoro elastomer copolymer
\* NBR: Nitrile-butadiene rubber (thermal decomposition temperature: 220° C.)
\* PI: Polyimide

[Preparation Example 1]—Manufacture of Metal Laminate

After the resin composition produced in Example 1 was applied on a copper foil (thickness: 18 μm) to have a thickness of 64 μm using first and second coating rolls, the applied resin composition was dried at 140° C. for about 3 minutes, thereby manufacturing a first unit member in which a resin layer in a state where an organic solvent had been evaporated was formed. A second unit member was manufactured by the same method as the method for manufacturing the first unit member. Then, after the second unit member was laminated on the first unit member such that the resin layer of the first unit member and the resin layer of the second unit member are brought into contact with each other, a metal laminate was manufactured by pressing the first unit member and the second unit member on a hot plate at 320° C. at a pressure of 30 kg for 4 hours.

[Preparation Examples 2 to 8]—Manufacture of Metal Laminate

Each metal laminate was manufactured in the same manner as in Preparation Example 1, except that the resin compositions of Examples 2 to 8 described in Table 1 were used, respectively instead of the resin composition of Example 1 used in Preparation Example 1.

[Comparative Preparation Examples 1 to 4]—Manufacture of Metal Laminate

Each metal laminate was manufactured in the same manner as in Preparation Example 1, except that the resin compositions of Comparative Examples 1 to 4 described in Table 1 were used, respectively instead of the resin composition of Example 1 used in Preparation Example 1.

[Experimental Example 1]—Dielectric Constant and Dissipation Factor of Metal Laminate The dielectric constant and dielectric loss of the resin layer in each of the metal laminates manufactured in Preparation Examples 1 to 8 and Comparative Examples 1 to 4 were measured as follows, and the results thereof are shown in the following Tables 2 and 3.

A copper foil was removed by impregnating the metal laminate with an etching solution (hydrochloric acid:hydrogen peroxide=1:2 volume ratio) according to the IPC TM 650 2.5.5.9 evaluation standard, the dielectric constant (Dk) and dissipation factor (Df) at a frequency of 10 GHz were each measured using a dielectric constant measurement device (RF Impedance/Material Analyzer; Agilent), and the change in dielectric constant (TCK) over temperature was measured by measuring a dielectric constant (Dk) at −25 to 125° C.

TABLE 2

| | Example | | | | | | | |
|---|---|---|---|---|---|---|---|---|
| | 1 | 2 | 3 | 4 | 5 | 6 | 7 | 8 |
| Dielectric constant (Dk, @10 GHz) | 2.58 | 5.19 | 3.14 | 3.15 | 6.00 | 3.02 | 2.96 | 3.00 |
| Dissipation factor (Df, @GHz) | 0.0009 | 0.0009 | 0.0010 | 0.0010 | 0.0013 | 0.0010 | 0.0011 | 0.0011 |
| TCK (ppm/° C.) | 3.01 | 1.32 | 0.33 | 2.74 | 2.92 | 1.32 | 1.32 | 0.31 |

TABLE 3

| | Comparative Example | | | |
|---|---|---|---|---|
| | 1 | 2 | 3 | 4 |
| Dielectric constant (Dk, @10 GHz) | 1.97 | 1.95 | 1.89 | 1.98 |
| Dissipation factor (Df, @10 GHz) | 0.0036 | 0.0040 | 0.0043 | 0.0027 |
| TCK (ppm/° C.) | 6.24 | 6.24 | 5.43 | 4.26 |

The invention claimed is:

1. A resin composition comprising:
   an elastomer selected from the group consisting of a fluoroelastomer, a styrene-based elastomer, and a combination thereof;
   a fluororesin filler;
   an inorganic filler; and
   an organic solvent.

2. The resin composition of claim 1, wherein the elastomer has a dissipation factor (Df) of 0.0005 to 0.0020 at 10 GHz, or has a dielectric constant (Dk) of 2.0 to 3.0 at 10 GHz.

3. The resin composition of claim 1, wherein the fluoroelastomer has a fluorine content of 20 to 50 wt %, and the styrene-based elastomer has a styrene content of 20 to 50 wt %.

4. The resin composition of claim 1, wherein the elastomer has a thermal decomposition temperature of 350° C. or higher, or has a melt flow rate (MFR) of 0.01 g/10 min or less under conditions of 230° C. and 2 kg.

5. The resin composition of claim 1, wherein the fluororesin filler has a melting point of 300° C. or higher, or has a melt flow rate (MFR) of 50 g/10 min or less under conditions of 372° C. and 2 kg.

6. The resin composition of claim 1, wherein the fluororesin filler has an average particle diameter of 0.01 to 50 μm, or
   wherein the inorganic filler has an average particle diameter of 5 to 20 μm.

7. The resin composition of claim 1, wherein the inorganic filler comprises (a) silica; and (b) alumina or titania at a weight ratio of 0.5 to 12:1.

8. The resin composition of claim 1, wherein the resin composition comprises:
   1 to 10 wt % of an elastomer;
   25 to 75 wt % of a fluororesin filler; and
   15 to 65 wt % of an inorganic filler,
   based on 100 wt % of the resin composition.

9. A metal laminate comprising: a resin layer formed of the resin composition of claim 1 and having a dissipation factor (Df) of 0.0005 to 0.0020 at 10 GHz; and
   a metal layer disposed on both sides of the resin layer, respectively.

10. The metal laminate of claim 9, wherein the resin layer has a dielectric constant of 2 to 8 at 10 GHz.

11. The metal laminate of claim 9, wherein the resin layer comprises:
    a first resin layer formed of the resin composition of claim 1 and having a dissipation factor (Df) of 0.0005 to 0.0020 at 10 GHz; and
    a second resin layer formed of the resin composition of claim 1 and having a dissipation factor (Df) of 0.0005 to 0.0020 at 10 GHz,
    the first resin layer and the second resin layer are the same as or different from each other.

12. The metal laminate of claim 9, wherein the resin layer has a coefficient of thermal expansion (CTE) of 10 to 50 ppm/° C., or
    wherein a peel strength between the resin layer and the metal layer is 0.5 to 3 kg/cm, or
    wherein the resin layer has an elastic modulus of 0.2 to 2 GPa.

13. A printed circuit board comprising the metal laminate of claim 9.

14. A method for manufacturing a metal laminate, the method comprising:
    preparing two unit members in which a resin layer applied on one surface of a metal base material is formed by applying the resin composition of claim 1 on one surface of the metal base material and drying the resin composition at 50 to 180° C.; and laminating the two unit members and pressurizing the two unit members, such that the resin layers of the unit members are brought into contact with each other.

15. The metal laminate of claim 9, wherein the elastomer has a dissipation factor (Df) of 0.0005 to 0.0020 at 10 GHz, or a dielectric constant (Dk) of 2.0 to 3.0 at 10 GHz.

16. The metal laminate of claim 9, wherein the fluoroelastomer has a fluorine content of 20 to 50 wt %, and the styrene-based elastomer has a styrene content of 20 to 50 wt %.

17. The metal laminate of claim 9, wherein the elastomer has a thermal decomposition temperature of 350° C. or higher, or a melt flow rate (MFR) of 0.01 g/10 min or less under conditions of 230° C. and 2 kg; or wherein the fluororesin filler has a melting point of 300° C. or higher, or a melt flow rate (MFR) of 50 g/10 min or less under conditions of 372° C. and 2 kg.

18. The metal laminate of claim 9, wherein the resin composition comprises:

1 to 10 wt % of an elastomer;

25 to 75 wt % of a fluororesin filler; and 15 to 65 wt % of an inorganic filler, based on 100 wt % of the resin composition.

* * * * *